United States Patent
Jung et al.

(10) Patent No.: US 11,991,903 B2
(45) Date of Patent: May 21, 2024

(54) DISPLAY DEVICE

(71) Applicant: LG DISPLAY CO., LTD., Seoul (KR)

(72) Inventors: YuHo Jung, Gyeonggi-do (KR); DukYoung Jeong, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/354,765

(22) Filed: Jun. 22, 2021

(65) Prior Publication Data
US 2022/0069042 A1 Mar. 3, 2022

(30) Foreign Application Priority Data
Aug. 27, 2020 (KR) .......................... 10-2020-0108324

(51) Int. Cl.
 *H10K 59/124* (2023.01)
 *H10K 59/40* (2023.01)
 *H10K 77/10* (2023.01)

(52) U.S. Cl.
 CPC ........... *H10K 59/124* (2023.02); *H10K 59/40* (2023.02); *H10K 77/10* (2023.02)

(58) Field of Classification Search
 CPC .... H10K 50/80; H10K 59/124; H10K 59/121; H10K 59/40; H10K 59/1201; H10K 71/80; H10K 77/10
 See application file for complete search history.

(56) References Cited

U.S. PATENT DOCUMENTS

| 11,177,462 | B2 | 11/2021 | Park et al. | |
| 11,233,220 | B2 | 1/2022 | Seo et al. | |
| 11,374,030 | B2 | 6/2022 | Zhang | |
| 2017/0237038 | A1* | 8/2017 | Kim | H10K 77/10 |
| | | | | 257/40 |
| 2017/0288004 | A1* | 10/2017 | Kim | H10K 77/10 |
| 2018/0190735 | A1* | 7/2018 | Son | G02F 1/133528 |
| 2019/0288047 | A1* | 9/2019 | Jeong | H10K 50/11 |
| 2019/0334120 | A1* | 10/2019 | Seo | G06F 3/0444 |
| 2020/0052054 | A1* | 2/2020 | Park | H10K 59/1213 |
| 2020/0133415 | A1* | 4/2020 | Choi | G06F 3/0446 |
| 2020/0176708 | A1* | 6/2020 | Kanaya | H10K 50/15 |
| 2021/0167141 | A1* | 6/2021 | Park | H10K 77/10 |
| 2021/0408450 | A1* | 12/2021 | Wang | H10K 77/10 |

FOREIGN PATENT DOCUMENTS

| KR | 10-2019-0126016 A | 11/2019 |
| KR | 10-2020-0081626 A | 7/2020 |
| KR | 10-2020-0089743 A | 7/2020 |

* cited by examiner

*Primary Examiner* — Vongsavanh Sengdara
(74) *Attorney, Agent, or Firm* — Birch, Stewart, Kolasch & Birch, LLP

(57) ABSTRACT

A display device includes a display panel including a substrate and a plurality of insulating layers, a transistor layer, and a light emitting device layer on the substrate, and including a display area in which an image is displayed, the display area including a first display area and a second display area, and a light receiving device positioned behind the display panel and overlapping the first display area. In the display device, the first display area includes at least one non-transmissive area in which transistors and light emitting devices are located, and at least one transmissive area through which external light is transmitted to the light receiving device. The substrate or at least one insulating layer includes at least one hole or at least one uneven portion in a portion overlapping the transmissive area in the first display area.

20 Claims, 27 Drawing Sheets

PA in NTA

TA

DISPLAY DEVICE

CROSS-REFERENCE TO RELATED APPLICATIONS

This application claims the benefit and priority to Korean Patent Application No. 10-2020-0108324, filed in the Republic of Korea on Aug. 27, 2020, the entire contents of which are hereby expressly incorporated by reference for all purposes as if fully set forth into the present application.

BACKGROUND

Technical Field

The present disclosure relates to a display device.

Description of the Related Art

With the development of technology, a display device can provide a photographing function and a proximity detection function in addition to an image display function. Accordingly, the display device can include a light receiving device such as a camera and a proximity sensor.

Since the light receiving device needs to receive light from the front of the display device, it needs to be installed in a place where the light receiving is advantageous. Therefore, in the related art, the camera (camera lens) and the proximity sensor had to be installed so as to be exposed on the front side of the display device. As a result, the bezel of the display device is widened or a notch or hole is formed in the display area of the display panel, so that a camera lens or a proximity sensor is installed there.

Therefore, as a light receiving device such as a camera or a proximity sensor that performs a predetermined function by receiving the front light is provided in the display device, there may be problems in that the bezel is enlarged at the front of the display device or that the front design of the display device is restricted.

SUMMARY OF THE INVENTION

Embodiments of the present disclosure can provide a display device in which a light receiving device is positioned behind a display panel so that the light receiving device that should receive light from the front is not exposed to the front. Here, for example, the light receiving device can include one or more of a camera, a proximity sensor, and the like.

Embodiments of the present disclosure can provide a display device in which light from the front of a display panel can be well transmitted to a light receiving device through a display panel even if the light receiving device is positioned behind the display panel.

Embodiments of the present disclosure can provide a display device in which a region overlapping a light receiving device in the display panel has a higher transmittance than other regions.

Embodiments of the present disclosure can provide a display device in which a transmittance improving structure is formed in a region overlapping a light receiving device in a display panel.

According to aspects of the present disclosure, a display device comprises a display panel including a substrate and a plurality of insulating layers, a transistor layer, and a light emitting device layer on the substrate, and including a display area in which an image is displayed, the display area including a first display area and a second display area, and a light receiving device positioned behind the display panel and overlapping with the first display area.

The number of subpixels per unit area in the first display area is smaller than the number of subpixels per unit area in the second display area.

The first display area includes at least one non-transmissive area in which transistors of the transistor layer and light emitting devices of the light emitting device layer are located, and at least one transmissive area through which external light is transmitted to the light receiving device.

The substrate or at least one insulating layer among the plurality of insulating layers includes at least one hole or at least one uneven portion in a portion overlapping the one transmissive area.

The one uneven portion can be formed on a rear surface of the substrate, and a portion of the substrate that overlaps the one transmissive area can include at least one raised rear surface.

The display device can further include a transparent material layer disposed under the one raised rear surface of the substrate.

At least one uneven portion can be formed on an upper surface of the substrate, and a portion of the substrate that overlaps the one transmissive area can include at least one recessed upper surface.

The substrate can include a first substrate, an interlayer insulating layer on the first substrate, and a second substrate on the interlayer insulating layer.

The one uneven portion can be formed on a rear surface of the first substrate, and a portion of the first substrate that overlaps the one transmissive area can include at least one raised rear surface.

The display device can further include a transparent material layer disposed under the one raised rear surface of the first substrate.

The one uneven portion can be formed on an upper surface of the second substrate, and a portion of the second substrate that overlaps the one transmissive area can include at least one recessed upper surface or the one hole.

The plurality of insulating layers can include a buffer layer between the substrate and the transistor layer, a planarization layer between the transistor layer and the light emitting device layer, and an encapsulation layer on the light emitting device layer.

The planarization layer can include the one uneven portion at a portion overlapping the one transmissive area in the first display area.

a concave portion constituting the one uneven portion of the planarization layer can pass through the insulating layers included in the transistor layer and the buffer layer positioned under the insulating layers and can descend to the upper portion of the substrate.

The display panel can further include a plurality of touch sensors disposed on the encapsulation layer and a protective layer on the plurality of touch sensors. The protective layer can include at least one uneven portion at a portion overlapping the one transmissive area.

The plurality of touch sensors can include mesh-type touch sensor metals, and an area of the touch sensor metals per unit area in the first display area can be smaller than an area of the touch sensor metals per unit area in the second display area.

The plurality of touch sensors is disposed in the one non-transmissive area and the plurality of touch sensors is not disposed in the one transmissive area.

At least one insulating layer including a transmittance improving structure can include an organic insulating material.

At least one insulating layer including the transmittance improving structure can include a photosensitive material.

The substrate can include a non-photosensitive material.

The shape or size of a concave-convex portion in a portion where the substrate overlaps the one transmissive area and the shape or size of a concave-convex portion in a portion where the one insulating layer overlaps the one transmissive area can be different from each other.

The number of subpixels per unit area in the first display area is ½ or ¼ of the number of subpixels per unit area in the second display area.

The second display area can include a first area, a second area, a third area, and a fourth area. Each of the first area, the second area, the third area, and the fourth area can be the one non-transmissive area in which four subpixels are disposed. The first display area can include a fifth area, a sixth area, a seventh area, and an eighth area. Areas of the fifth area, the sixth area, the seventh area, and the eighth area can correspond to areas of the first area, the second area, the third area, and the fourth area. Among the fifth area, the sixth area, the seventh area, and the eighth area, some areas can be the one non-transmissive area in which four subpixels are disposed, and another partial area can be the one transmissive area in which no subpixels are disposed.

The light receiving device can include at least one of a camera and a proximity sensor, and the light receiving device may not be exposed on the front of the display panel.

According to aspects of the present disclosure, a display device comprises a display panel including a substrate and a plurality of insulating layers, a transistor layer, and a light emitting device layer on the substrate, and including a display area in which an image is displayed, the display area including a first display area and a second display area, and a light receiving device positioned behind the display panel and overlapping with the first display area.

The number of subpixels per unit area in the first display area is smaller than the number of subpixels per unit area in the second display area, The first display area includes at least one non-transmissive area in which transistors of the transistor layer and light emitting devices of the light emitting device layer are located, and at least one transmissive area through which external light is transmitted to the light receiving device.

The substrate or at least one insulating layer can have a variable thickness in a portion overlapping the one transmissive area.

According to embodiments of the present disclosure, the display device in which the light receiving device (e.g., camera, proximity sensor, etc.) is positioned behind the display panel can be provided so that the light receiving device that should receive light from the front is not exposed to the front.

According to embodiments of the present disclosure, even if the light receiving device is positioned behind the display panel, it is possible to provide the display device in which light from the front surface of the display panel can be well transmitted to the light receiving device through the display panel.

According to embodiments of the present disclosure, it is possible to provide the display device having a higher transmittance in the display panel in a region overlapping with the light receiving device compared to other regions.

According to embodiments of the present disclosure, the display device in which a transmittance improving structure is formed in a region overlapping with the light receiving device in the display panel can be provided.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION OF THE EMBODIMENTS

Figure 1:
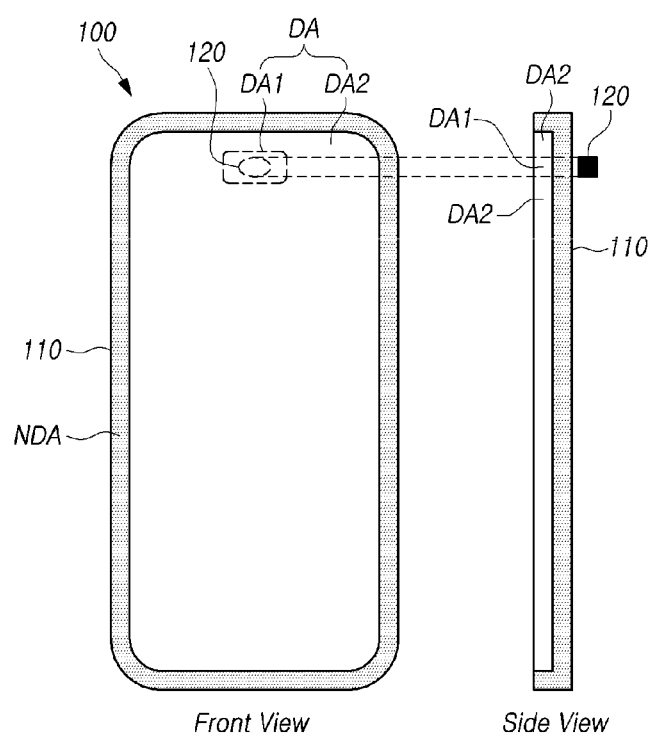
FIG. 1 is a schematic diagram of a display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description can make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

FIG. 1 is a schematic diagram of a display device 100 according to embodiments of the present disclosure. All the components of the display device according to all embodiments of the present disclosure are operatively coupled and configured.

Referring to FIG. 1, the display device 100 according to the embodiments of the present disclosure can include a display panel 110 displaying an image and a light receiving device 120 receiving light.

The display panel 110 can include a substrate, and a plurality of insulating layers, a transistor layer, a light emitting device layer, and the like on the substrate.

The display panel 110 can include a plurality of subpixels for displaying an image and various signal lines for driving the plurality of subpixels. The signal lines can include a plurality of data lines, a plurality of gate lines, and a plurality of power lines. Here, each of the plurality of subpixels can include a transistor positioned in the transistor layer and a light emitting device positioned in the light emitting device layer.

The display panel 110 can include a display area DA in which an image is displayed and a non-display area NDA that is an area outside the display area DA. A plurality of subpixels can be disposed in the display area DA. The various signal lines can be disposed in the non-display area NDA, and a driving circuit can be connected to the non-display area NDA. The non-display area NDA can be bent and may not be visible from the front side. The non-display area NDA can be obscured by a case. The non-display area NDA can be visible from the front, but an image may not be displayed. The non-display area NDA is also referred to as a bezel.

Referring to FIG. 1, the display area DA can include a first display area DA1 and a second display area DA2.

The light receiving device 120 is a device that receives light and performs a predetermined function. For example, the light receiving device 120 can include one or more cameras and/or one or more proximity sensors.

The light receiving device 120 can be a device requiring light reception, but can be located behind (below) the display panel 110. For example, the light receiving device 120 can be located on the opposite side of the viewing surface of the display panel 110. The light receiving device 120 may not be exposed on the front surface of the display device 100. Therefore, when the user looks at the front of the display device 110, the light receiving device 120 may not be visible by user.

A camera positioned behind (below) the display panel 110 can be a front photographing camera that photographs the front of the display device 100. The camera described herein can also be referred to as a camera lens.

Referring to FIG. 1, the light receiving device 120 can be disposed to overlap the display area DA of the display panel 110. For example, the light receiving device 120 can be located in the display area DA.

In the display area DA, an area overlapping the light receiving device 120 is referred to as the first display area DA1, and the remaining area is referred to as the second display area DA2. Accordingly, the light receiving device 120 can be positioned to overlap the first display area DA1 in the display area DA. In other words, the light receiving device 120 can be considered to be located in the first display area DA1 in the display area DA.

Since the first display area DA1 in the display area DA is an area overlapping the light receiving device 120, the transmittance of the first display area DA1 in the display area DA should be higher than the transmittance of the second display area DA2 that does not overlap with the light receiving device 120.

In order to improve the transmittance of the first display area DA1 overlapping the light receiving device 120, the resolution, subpixel arrangement structure, number of subpixels per unit area, electrode structure, wiring structure, electrode arrangement structure, or wiring arrangement structure can be different in the first display area DA1 and the second display area DA2.

For example, the number of subpixels per unit area in the first display area DA1 can be smaller than the number of subpixels per unit area in the second display area DA2. Accordingly, the resolution of the first display area DA1 can be lower than that of the second display area DA2.

In the display device 100 according to embodiments of the present disclosure, the camera, which is the light receiving device 120 located under the display panel 100 without being exposed to the outside, is also referred to as an Under Display Camera (UDC).

In the case of the display device 100 according to embodiments, a smaller bezel can be provided, and the notch-shaped display panel 110 may not be manufactured. In addition, design restrictions due to the light receiving device 120 can be reduced or eliminated, so that a degree of freedom in design can be increased.

In the display device 100 according to embodiments of the present disclosure, although the light receiving device 120 is positioned behind the display panel 110, the light receiving device 120 can normally receive light and perform a predetermined function normally. In addition, in the display device 100 according to embodiments of the present disclosure, although the light receiving device 120 is positioned behind the display panel 110 and overlapped with the display area DA, the light receiving device 120 can normally receive light through the display area DA. Accordingly, the predetermined function through light reception can be normally performed. In the display device 100 according to embodiments of the present disclosure, although the light receiving device 120 is positioned behind the display panel 110 and overlapped with the display area DA, the display device 100 can perform normal image display in the display area DA.

Accordingly, the display device 100 according to embodiments of the present disclosure provides a structure capable of improving the transmittance of the first display area DA1 overlapping the light receiving device 120.

Figure 2:
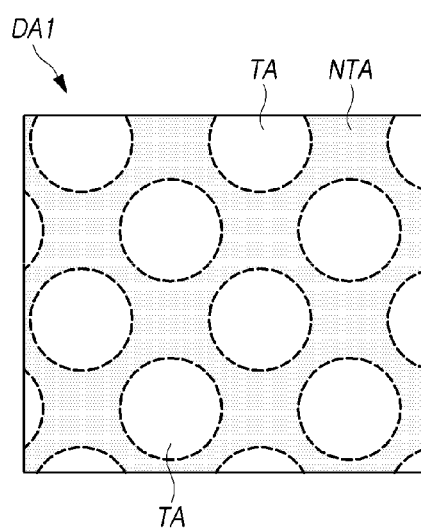
FIGS. 2 and 3 are plan views of a first display area in the display device according to embodiments of the present disclosure.
Figure 3:
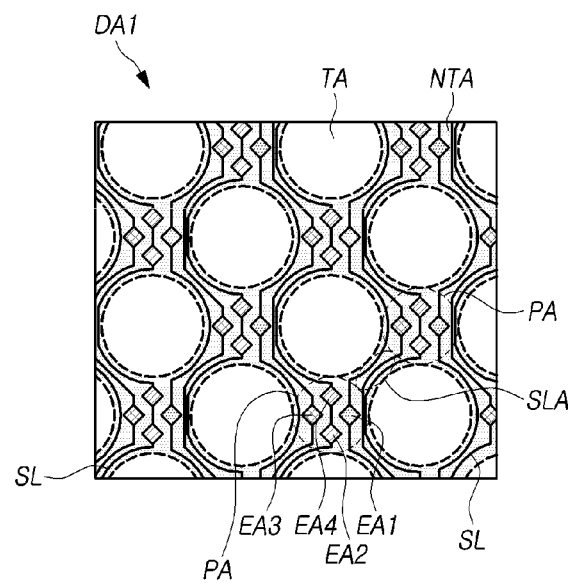

FIGS. 2 and 3 are plan views of the first display area DA1 in the display device 100 according to embodiments of the present disclosure.

FIG. 3 illustrates the first display area DA1 in which signal lines SL and emission areas EA1, EA2, EA3, and EA4 of subpixels are additionally displayed compared to FIG. 2.

Referring to FIGS. 2 and 3, the first display area DA1 can be an area overlapping the light receiving device 120. The first display area DA1 can include at least one non-transmissive area NTA and at least one transmissive area TA.

Referring to FIGS. 2 and 3, the at least one transmissive area TA can be at least one partial area included in the first display area DA1 and can be at least one area through which external light is transmitted to the light receiving device 120. For example, each transmissive area TA can have a circular or elliptical shape, and can also be referred to as a hole area.

Referring to FIGS. 2 and 3, the at least one non-transmissive area NTA can be at least one partial area included in the first display area DA1. The at least one non-transmissive area NTA can be at least one area in which the transistors of the transistor layer and the light emitting devices of the light emitting device layer are located.

Referring to FIGS. 2 and 3, the at least one non-transmissive area NTA can include a pixel area PA in which the emission areas EA1, EA2, EA3, and EA4 of the subpixels exist, and a signal line area SLA in which the signal lines SL are disposed.

Referring to FIGS. 2 and 3, when each transmissive area TA is surrounded by the at least one non-transmissive area NTA, the first display area DA1 can include a plurality of transmissive areas TA separated from each other.

Figure 4:
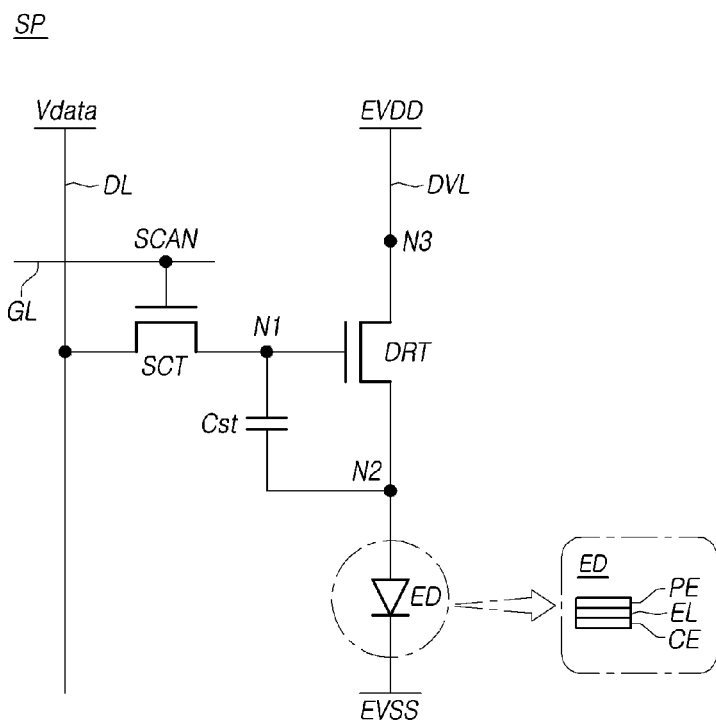
FIG. 4 is an equivalent circuit for a subpixel in the display device according to embodiments of the present disclosure.

FIG. 4 is an equivalent circuit for a subpixel SP in the display device 100 according to embodiments of the present disclosure.

Referring to FIG. 4, each or at least one of the plurality of subpixels SP disposed on the display panel 110 of the display device 100 according to embodiments of the present disclosure can include a light emitting device ED, a driving transistor DRT, a scan transistor SCT, a storage capacitor Cst, and the like.

The light emitting device ED can include a pixel electrode PE and a common electrode CE, and a light emitting layer EL positioned between the pixel electrode PE and the common electrode CE. Here, the pixel electrode PE can be disposed in each subpixel SP, and the common electrode CE can be disposed in common with a plurality of subpixels SP. For example, the pixel electrode PE can be an anode electrode, and the common electrode CE can be a cathode electrode. For another example, the pixel electrode PE can be a cathode electrode, and the common electrode CE can be an anode electrode. For example, the light emitting device ED can be an organic light emitting diode (OLED), an inorganic light emitting diode (ILED), or a quantum dot light emitting device. The inorganic light emitting diode (ILED) can be a micro light emitting diode.

The driving transistor DRT can be a transistor for driving the light emitting device ED, and can include a first node N1, a second node N2, a third node N3, and the like.

The first node N1 of the driving transistor DRT can be a gate node of the driving transistor DRT, and can be electrically connected to a source node or a drain node of the scan transistor SCT. The second node N2 of the driving transistor DRT can be a source node or a drain node of the driving transistor DRT, and can be electrically connected to the pixel electrode PE of the light emitting device ED. The third node N3 of the driving transistor DRT can be electrically connected to the driving voltage line DVL supplying the driving voltage EVDD.

The scan transistor SCT can be controlled by the scan signal SCAN and can be connected between the first node N1 of the driving transistor DRT and the data line DL. The scan transistor SCT can be turned on or off according to the scan signal SCAN supplied from the gate line GL. Accordingly, the scan transistor SCT can control a connection between the data line DL and the first node N1 of the driving transistor DRT.

The scan transistor SCT can be turned on by a scan signal SCAN having a turn-on level voltage. Accordingly, the scan transistor SCT can transmit the data voltage Vdata supplied from the data line DL to the first node N1 of the driving transistor DRT.

The turn-on level voltage of the scan signal SCAN capable of turning on the scan transistor SCT can be a high level voltage or a low level voltage. The turn-off level voltage of the scan signal SCAN capable of turning off the scan transistor SCT can be a low level voltage or a high level voltage. For example, when the scan transistor SCT is an n-type transistor, the turn-on level voltage can be a high level voltage and the turn-off level voltage can be a low level voltage. For another example, when the scan transistor SCT is a p-type transistor, the turn-on level voltage can be a low level voltage and the turn-off level voltage can be a high level voltage.

Each of the driving transistor DRT and the scan transistor SCT can be an n-type transistor or a p-type transistor.

The storage capacitor Cst can be connected between the first node N1 and the second node N2 of the driving transistor DRT. The storage capacitor Cst can charge the amount of charge corresponding to the voltage difference between both ends and can maintain the voltage difference between both ends for a predetermined frame time. Accordingly, during a predetermined frame time, the subpixel SP can emit light.

The storage capacitor Cst may not be a parasitic capacitor (e.g., Cgs, Cgd), which is an internal capacitor existing between a gate node and a source node (or drain node) of the driving transistor DRT, but can be an external capacitor intentionally designed outside the driving transistor DRT.

The subpixel SP of the display device 100 according to embodiments can further include one or more transistors and/or can further include one or more capacitors.

Figure 5:
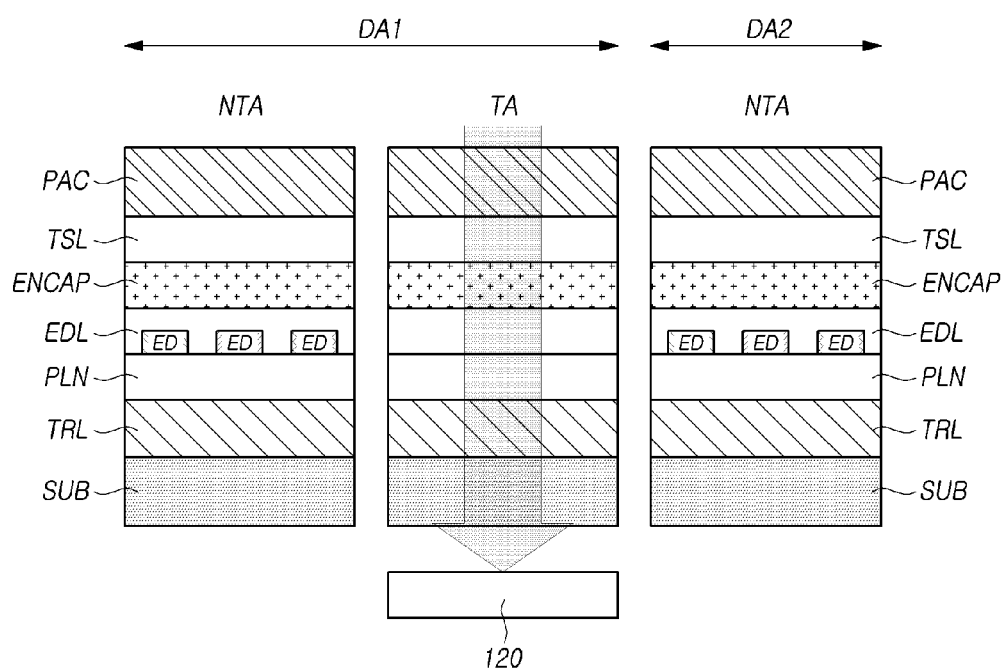
FIG. 5 is a diagram illustrating a cross-sectional structure of a non-transmissive area in the first display area, a cross-sectional structure of a transmissive area in the first display area, and a cross-sectional structure of a second display area in the display device according to embodiments of the present disclosure.

FIG. 5 is a diagram illustrating a cross-sectional structure of the non-transmissive area NTA in the first display area DA1, a cross-sectional structure of the transmissive area TA in the first display area DA1, and a cross-sectional structure of the second display area DA2 in the display device 100 according to embodiments of the present disclosure.

Referring to FIG. 5, the first display area DA1 of the display panel 110 can include at least one transmissive area TA and at least one non-transmissive area NTA. The second display area DA2 of the display panel 110 can be viewed as a non-transmissive area NTA.

Referring to FIG. 5, a stacked structure of at least one non-transmissive area NTA in the first display area DA1, a stacked structure of at least one transmissive area TA in the first display area DA1, and a stacked structure of the second display area DA2 will be described below.

Referring to FIG. 5, the stacked structure of the second display area DA2 is as follows.

In the second display area DA2, a transistor layer TRL can be disposed on the substrate SUB, a planarization layer PLN can be disposed on the transistor layer TRL, a light emitting device layer EDL can be disposed on the planarization layer PLN, an encapsulation layer ENCAP can be disposed on the light emitting device layer EDL, a touch sensor layer TSL can be disposed on the encapsulation layer ENCAP, and a protective layer PAC can be disposed on the touch sensor layer TSL.

In the second display area DA2, transistors such as the driving transistor DRT and the scan transistor SCT of each subpixel SP can be disposed in the transistor layer TRL, and various insulating layers for forming transistors can be further disposed in the transistor layer TRL. Here, various insulating layers can include at least one organic layer and/or at least one inorganic layer.

In the second display area DA2, various signal lines, such as data lines DL, gate lines GL, and driving voltage lines DVL, can be disposed in the transistor layer TRL.

In the second display area DA2, the light emitting device ED of each subpixel SP can be disposed in the light emitting device layer EDL. Accordingly, in the light emitting device layer EDL in the second display area DA2, the pixel electrode PE, the light emitting layer EL, and the common electrode CE constituting the light emitting device ED can be disposed.

In the second display area DA2, a plurality of touch sensors TS can be disposed on the touch sensor layer TSL. In addition, in the second display area DA2, a touch buffer layer and a touch insulating layer required to form a plurality of touch sensors TS can be further disposed on the touch sensor layer TSL.

Referring to FIG. 5, the stacked structure of at least one non-transmissive area NTA in the first display area DA1 can be the same as that of the second display area DA2.

In the non-transmissive area NTA in the first display area DA1, a transistor layer TRL can be disposed on the substrate SUB, a planarization layer PLN can be disposed on the transistor layer TRL, a light emitting device layer EDL can be disposed on the planarization layer PLN, an encapsulation layer ENCAP can be disposed on the light emitting device layer EDL, a touch sensor layer TSL can be disposed on the encapsulation layer ENCAP, and a protective layer PAC can be disposed on the touch sensor layer TSL.

The light emitting device ED can be vulnerable to moisture or oxygen. The encapsulation layer ENCAP can prevent penetration of moisture or oxygen, thereby preventing the light emitting device ED from being exposed to moisture or oxygen. The encapsulation layer ENCAP can be a single layer. Alternatively, the encapsulation layer ENCAP can include multiple layers.

In the non-transmissive area NTA in the first display area DA1, transistors such as the driving transistor DRT and the scan transistor SCT of each subpixel SP can be disposed in the transistor layer TRL. Various insulating layers for forming transistors can be further disposed in the transistor layer TRL. Here, various insulating layers can include at least one organic layer and/or at least one inorganic layer.

In the non-transmissive area NTA in the first display area DA1, various signal lines, such as data lines DL, gate lines GL, and driving voltage lines DVL, can be disposed in the transistor layer TRL.

In the non-transmissive area NTA in the first display area DA1, the light emitting device ED of each subpixel SP can be disposed in the light emitting device layer EDL. Accordingly, in the light emitting device layer EDL in the first display area DA1, the pixel electrode PE, the emission layer EL, and the common electrode CE constituting the light emitting device ED can be disposed.

In the non-transmissive area NTA in the first display area DA1, a plurality of touch sensors TS can be disposed in the touch sensor layer TSL. In addition, in the non-transmissive area NTA in the first display area DA1, a touch buffer layer and a touch insulating layer required to form a plurality of touch sensors TS can be further disposed.

Referring to FIG. 5, the stacked structure of the transmissive area TA in the first display area DA1 can be as follows.

Referring to FIG. 5, in the transmissive area TA in the first display area DA1, a transistor layer TRL can be disposed on the substrate SUB, a planarization layer PLN can be disposed on the transistor layer TRL, a light emitting device layer EDL can be disposed on the planarization layer PLN, an encapsulation layer ENCAP can be disposed on the light emitting device layer EDL, a touch sensor layer TSL can be disposed on the encapsulation layer ENCAP, and a protective layer PAC can be disposed on the touch sensor layer TSL.

In the transmissive area TA in the first display area DA1, transistors such as the driving transistor DRT and the scan transistor SCT of each subpixel SP and various signal lines can be disposed in the transistor layer TRL. In the transmissive area TA in the first display area DA1, the light emitting device ED of each subpixel SP can be disposed in the light emitting device layer EDL. In the transmissive area TA in the first display area DA1, a plurality of touch sensors TS can be disposed on the touch sensor layer TSL.

Alternatively, transistors and signal lines may not be disposed in the transistor layer TRL in the at least one transmissive area TA in the first display area DA1. However, in the transmissive area TA in the first display area DA1, various insulating layers can be disposed in the transistor layer TRL. Here, various insulating layers can include at least one organic layer and/or at least one inorganic layer.

In the transmissive area TA in the first display area DA1, the light emitting device ED of each subpixel SP may not be disposed in the light emitting device layer EDL. Accordingly, in the transmissive area TA in the first display area DA1, the pixel electrode PE, the emission layer EL, and the common electrode CE may not be disposed in the light emitting device layer EDL. In some cases, in the transmissive area TA in the first display area DA1, only a part of the pixel electrode PE, the emission layer EL, and the common electrode CE can be disposed in the light emitting device layer EDL. For example, in the transmissive area TA in the first display area DA1, only the emission layer EL can be disposed in the light emitting device layer EDL.

In the transmissive area TA in the first display area DA1, a plurality of touch sensors TS may not be disposed in the touch sensor layer TSL. However, in the transmissive area TA in the first display area DA1, a touch buffer layer and a touch insulating layer can be disposed on the touch sensor layer TSL.

Referring to FIG. 5, among a metal material layer and an insulating material layer disposed in the non-transmissive area NTA of the first display area DA1 and the non-transmissive area NTA of the second display area DA2, the metal material layer may not be disposed in the transmissive area TA in the first display area DA1. However, among the metal material layer and the insulating material layer disposed in the non-transmissive area NTA of the first display area DA1 and the non-transmissive area NTA of the second display area DA2, the insulating material layer can be disposed to extend to the transmissive area TA in the first display area DA1.

In other words, the metal material layer can be disposed in the non-transmissive area NTA of the first display area DA1 and the non-transmissive area NTA of the second display area DA2. However, the metal material layer may not be disposed in the transmissive area TA in the first display area DA1. The insulating material layer can be commonly disposed in the non-transmissive area NTA of the first display area DA1, the non-transmissive area NTA of the second display area DA2, and the transmissive area TA of the first display area DA1.

Referring to FIG. 5, the at least one transmissive area TA in the first display area DA1 of the display panel 110 can overlap the light receiving device 120.

External light can be transmitted to the light receiving device 120 through the at least one transmissive area TA in the first display area DA1. Accordingly, in order for the light receiving device 120 to operate normally, the transmittance of the at least one transmissive area TA in the first display area DA1 must be high.

Figure 6:
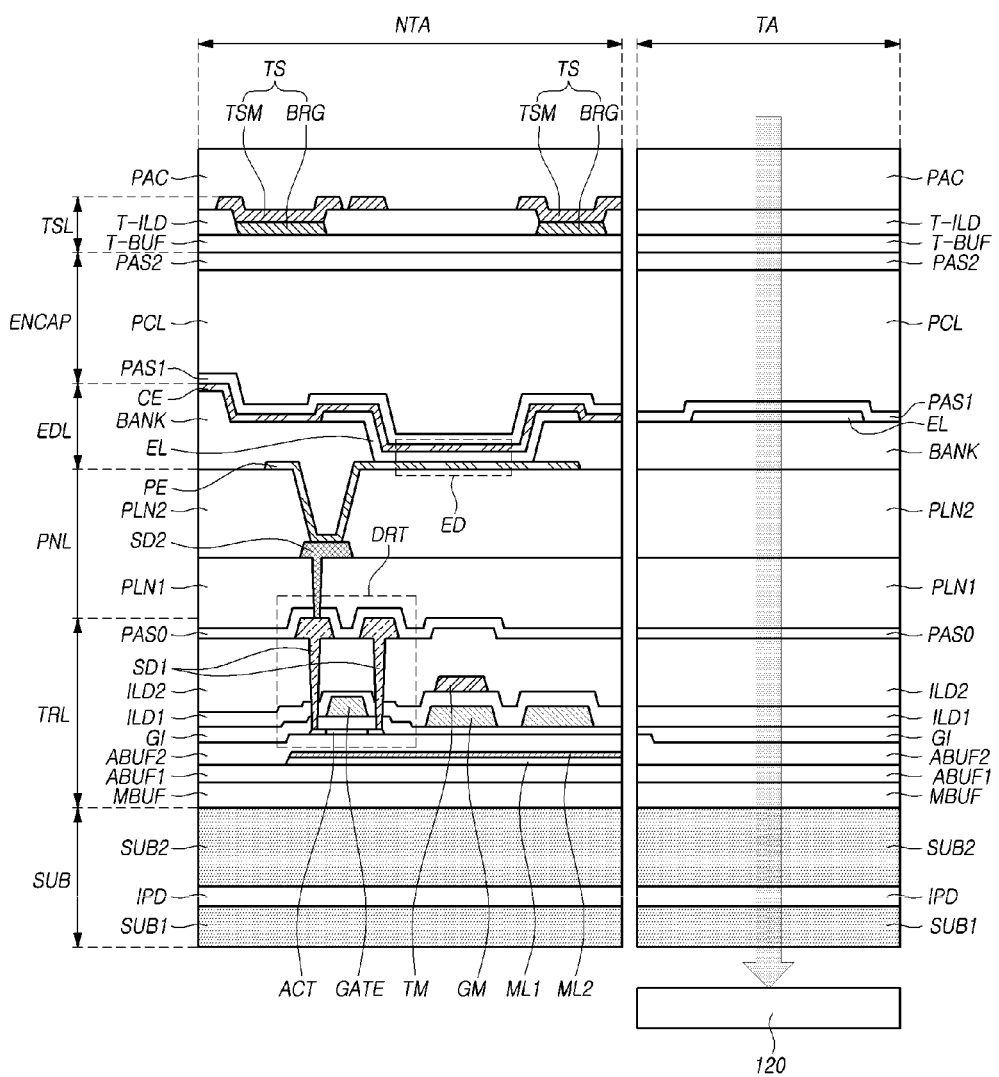
FIG. 6 is a cross-sectional view of the display device according to embodiments of the present disclosure.

FIG. 6 is a cross-sectional view of the display device 100 according to embodiments of the present disclosure. FIG. 6 is an example of a cross-sectional structure of the non-transmissive area NTA and the transmissive area TA in the first display area DA1.

Referring to FIG. 6, both the non-transmissive area NTA and the transmissive area TA included in the first display area DA1 can basically include the substrate SUB, the transistor layer TRL, the planarization layer PLN, the light emitting device layer EDL, the encapsulation layer ENCAP, the touch sensor layer TSL, and the protective layer PAC.

First, with reference to FIG. 6, a stacked structure of the non-transmissive area NTA included in the first display area DA1 will be described below.

The substrate SUB can include a first substrate SUB1, an interlayer insulating layer IPD, and a second substrate SUB2. The interlayer insulating layer IPD can be positioned between the first substrate SUB1 and the second substrate SUB2. By configuring the substrate SUB with the first substrate SUB1, the interlayer insulating layer IPD, and the second substrate SUB2, moisture penetration can be prevented. For example, the first substrate SUB1 and the second substrate SUB2 can be polyimide (PI) substrates.

The transistor layer TRL can include various patterns ACT, SD1, and GATE for forming a transistor (e.g., driving transistor DRT, scan transistor SCT, etc.), various insulating layers MBUF, ABUF1, ABUF2, GI, ILD1, ILD2, and PAS0, and various metal patterns TM, GM, ML1 and ML2. In FIG. 6, the driving transistor DRT formed on the transistor layer TRL is illustrated as an example.

In the following, the stacked structure of the transistor layer TRL is described in more detail.

A multi-buffer layer MBUF can be disposed on the second substrate SUB2, and a first active buffer layer ABUF1 can be disposed on the multi-buffer layer MBUF.

A first metal layer ML1 and a second metal layer ML2 can be disposed on the first active buffer layer ABUF1. Here, the first metal layer ML1 and the second metal layer ML2 can serve as a light shield.

A second active buffer layer ABUF2 can be disposed on the first metal layer ML1 and the second metal layer ML2. An active layer ACT of the driving transistor DRT can be disposed on the second active buffer layer ABUF2.

A gate insulating layer GI can be disposed to cover the active layer ACT.

A gate electrode GATE of the driving transistor DRT can be disposed on the gate insulating layer GI. In this case, a gate material layer GM can be disposed on the gate insulating layer GI together with the gate electrode GATE of the driving transistor DRT at a position different from the formation position of the driving transistor DRT.

A first interlayer insulating layer ILD1 can be disposed while covering the gate electrode GATE and the gate material layer GM. A metal pattern TM can be disposed on the first interlayer insulating layer ILD1. The second interlayer insulating layer ILD2 can be disposed while covering the metal pattern TM on the first interlayer insulating layer ILD1.

Two first source-drain electrode patterns SD1 can be disposed on the second interlayer insulating layer ILD2. One of the two first source-drain electrode patterns SD1 can be a source node of the driving transistor DRT, and the other can be a drain node of the driving transistor DRT.

The two first source-drain electrode patterns SD1 can be connected to one side and the other side of the active layer ACT through contact holes of the second interlayer insulating layer ILD2, the first interlayer insulating layer ILD1, and the gate insulating layer GI. A portion of the active layer ACT overlapping the gate electrode GATE can be a channel region. Of the two first source-drain electrode patterns SD1, one can be connected to one side (first non-channel region) of the channel region in the active layer ACT, and the other can be connected to the other side (second non-channel region) of the channel region in the active layer ACT.

The passivation layer PAS0 can be disposed while covering the two first source-drain electrode patterns SD1.

A planarization layer PLN can be disposed on the transistor layer TRL. The planarization layer PLN can include a first planarization layer PLN1 and a second planarization layer PLN2.

The first planarization layer PLN1 can be disposed on the passivation layer PAS0. A second source-drain electrode pattern SD2 can be disposed on the first planarization layer PLN1. The second source-drain electrode pattern SD2 can be connected to one (electrically corresponding to the N2 node in FIG. 4) of the two first source-drain electrode patterns SD1 through a contact hole of the first planarization layer PLN1.

The second planarization layer PLN2 can be disposed while covering the second source-drain electrode pattern SD2. The light emitting device layer EDL can be positioned on the second planarization layer PLN2.

The lamination structure of the light emitting device layer EDL will be described below.

The pixel electrode PE can be disposed on the second planarization layer PLN2. The pixel electrode PE can be electrically connected to the second source-drain electrode pattern SD2 through a contact hole of the second planarization layer PLN2.

The bank BANK can be disposed while covering a portion of the pixel electrode PE. The bank can open a portion corresponding to the emission area of the subpixel SP. A portion of the pixel electrode PE can be exposed as a portion in which the bank BANK is open. The light-emitting layer EL can be disposed on and around the open portion of the bank. Accordingly, the emission layer EL can be disposed on the pixel electrode PE exposed through the open portion of the bank.

A common electrode CE can be disposed on the emission layer EL. For example, the common electrode CE can be a cathode electrode.

The light emitting device ED can be formed by the pixel electrode PE, the light emitting layer EL, and the common electrode CE. The emission layer EL can include an organic layer.

An encapsulation layer ENCAP can be disposed on the light emitting device layer EDL described above.

The encapsulation layer (ENCAP) can have a single-layer structure or a multi-layer structure. For example, as shown in FIG. 6, the encapsulation layer ENCAP can include a first encapsulation layer PAS1, a second encapsulation layer PCL, and a third encapsulation layer PAS2.

The first encapsulation layer PAS1 and the third encapsulation layer PAS2 can be an inorganic layer, and the second encapsulation layer PCL can be an organic layer. Among the first encapsulation layer PAS1, the second encapsulation layer PCL, and the third encapsulation layer PAS2, the second encapsulation layer PCL can be the thickest and can serve as a planarization layer.

The first encapsulation layer PAS1 can be disposed on the common electrode CE, and can be disposed closest to the light emitting device ED. The first encapsulation layer PAS1 can be formed of an inorganic insulating material capable of low-temperature deposition. For example, the first encapsulation layer PAS1 can include silicon nitride (SiNx), silicon oxide (SiOx), silicon oxynitride (SiON), or aluminum oxide ($Al_2O_3$). Since the first encapsulation layer PAS1 is deposited in a low temperature atmosphere, during the deposition process, the first encapsulation layer PAS1 can prevent damage to the light emitting layer EL including an organic material vulnerable to the high temperature atmosphere.

The second encapsulation layer PCL can be formed to have a smaller area than the first encapsulation layer PAS1. In this case, the second encapsulation layer PCL can be formed to expose both ends of the first encapsulation layer PAS1. The second encapsulation layer PCL can serve as a buffer to relieve stress between layers due to bending of the display device 100 and can also serve to enhance planarization performance. For example, the second encapsulation layer PCL can include acrylic resin, epoxy resin, polyimide, polyethylene, or silicon oxycarbon (SiOC), and can include an organic insulating material. For example, the second encapsulation layer PCL can be formed through an inkjet method.

For reference, in the display panel 110, in order to prevent the encapsulation layer ENCAP from collapsing, one or more dams can exist at or near the end of the inclined surface of the encapsulation layer ENCAP. One or more dams can exist at a boundary point between the display area DA and the non-display area NDA, or can exist in the vicinity of the boundary point.

The second encapsulation layer PCL including organic matter can be located only on the inner side of the innermost first dam among the first dam and the second dam. In this case, the second encapsulation layer PCL may not exist on top of all dams. Alternatively, the second encapsulation layer PCL including an organic material can be positioned above at least the first dam among the first dam and the second dam. For example, the second encapsulation layer PCL can be extended and positioned only to the upper part of the first dam. Alternatively, the second encapsulation layer PCL can be positioned to extend to the upper part of the second dam through the upper part of the first dam.

The third encapsulation layer PAS2 can be disposed on the substrate SUB on which the second encapsulation layer PCL is formed, and be arranged to cover the upper and side surfaces of the second encapsulation layer PCL and the first encapsulation layer PAS1 respectively. The third encapsulation layer PAS2 can minimize or block external moisture or oxygen from penetrating into the first encapsulation layer PAS1 and the second encapsulation layer PCL. For example, the third encapsulation layer PAS2 can include an inorganic insulating material such as silicon nitride (SiNx), silicon oxide (SiOx), silicon oxynitride (SiON), or aluminum oxide ($Al_2O_3$).

The touch sensor layer TSL can be disposed on the above-described encapsulation layer ENCAP. Hereinafter, a stacked structure of the touch sensor layer TSL will be described.

The touch buffer layer T-BUF can be disposed on the encapsulation layer ENCAP, and the touch sensor TS can be disposed on the touch buffer layer T-BUF. The touch sensor TS can include touch sensor metals TSM and bridge metal BRG positioned on different layers. A touch interlayer insulating layer T-ILD can be disposed between the touch sensor metals TSM and the bridge metal BRG.

For example, the touch sensor metals TSM can include a first touch sensor metal TSM, a second touch sensor metal TSM, and a third touch sensor metal TSM disposed adjacent to each other. When the first touch sensor metal TSM and the second touch sensor metal TSM are electrically connected to each other and the third touch sensor metal TSM is disposed between the first touch sensor metal TSM and the second touch sensor metal TSM, the first touch sensor metal TSM and the second touch sensor metal TSM can be electrically connected through a bridge metal BRG positioned on a different layer from the first touch sensor metal TSM and the second touch sensor metal TSM. The bridge metal BRG can be insulated from the third touch sensor metal TSM by the touch interlayer insulating layer T-ILD.

When the touch sensor layer TSL is formed, a chemical solution (developer or etchant, etc.) used in a process or moisture from the outside can be generated. By disposing the touch buffer layer T-BUF and disposing the touch sensor layer TSL thereon, it is possible to prevent a chemical solution or moisture from penetrating into the light emitting layer EL containing an organic material during the manufacturing process of the touch sensor layer TSL. Accordingly, the touch buffer layer T-BUF can prevent damage to the light emitting layer EL vulnerable to chemicals or moisture.

In order to prevent damage to the light-emitting layer EL containing organic substances susceptible to high temperatures, the touch buffer layer T-BUF can include an organic insulating material that can be formed at a low temperature below a certain temperature (e.g., 100° C.). Here, the organic insulating materials can have a low dielectric constant of 1 to 3. For example, the touch buffer layer T-BUF can be formed of an acrylic-based, epoxy-based, or siloxan-based material. As the display device 100 is bent, the encapsulation layer ENCAP can be damaged, and the touch sensor metal TSM and BRG positioned on the touch buffer layer T-BUF can be broken. Since the touch buffer layer T-BUF is made of an organic insulating material and has a planarization performance, the touch buffer layer T-BUF can prevent damage to the encapsulation layer ENCAP or cracking of the touch sensor metal TSM and BRG even if the display device 100 is bent.

The protective layer PAC can be disposed while covering the touch sensor TS. The protective layer PAC can be an organic insulating layer.

Hereinafter, the stacked structure of the transmissive area TA in the first display area DA1 will be described with reference to FIG. 6.

Referring to FIG. 6, the substrate SUB and the insulating layers (MBUF, ABUF1, ABUF2, GI, ILD1, ILD2, PAS0, PLN(PLN1, PLN2), BANK, ENCAP(PAS1, PCL, PAS2), PAC) disposed in the non-transmissive area NTA in the first display area DA1 can be equally disposed in the transmissive area TA in the first display area DA1.

The insulating material included in the insulating layers can be disposed in the non-transmissive area NTA in the first display area DA1, and can also be disposed in the transmissive area TA in the first display area DA1. However, the material layer (e.g., metal material layer, semiconductor layer, etc.) having electrical characteristics is disposed in the non-transmissive area NTA in the first display area DA1, but may not be disposed in the transmissive area TA in the first display area DA1.

For example, the metal material layers ML1, ML2, GATE, GM, TM, SD1, and SD2 related to the transistor and the active layer ACT may not be disposed in the transmissive area TA. The pixel electrode PE and the common electrode CE included in the light emitting device ED may not be disposed in the transmissive area TA. The emission layer EL may or may not be disposed in the transmissive area TA. The touch sensor metal TSM and the bridge metal BRG included in the touch sensor TS may not be disposed in the transmissive area TA.

Since the transmissive area TA in the first display area DA1 of the display panel 110 overlaps with the light receiving device 120, the transmittance of the transmissive area TA in the first display area DA1 needs to be high for normal operation of the light receiving device 120.

To this end, in the display panel 110 of the display device 100 according to embodiments of the present disclosure, the transmissive area TA in the first display area DA1 can have a transmittance improving structure TIS. Hereinafter, the transmittance improving structure TIS will be described in detail.

Figure 7A:
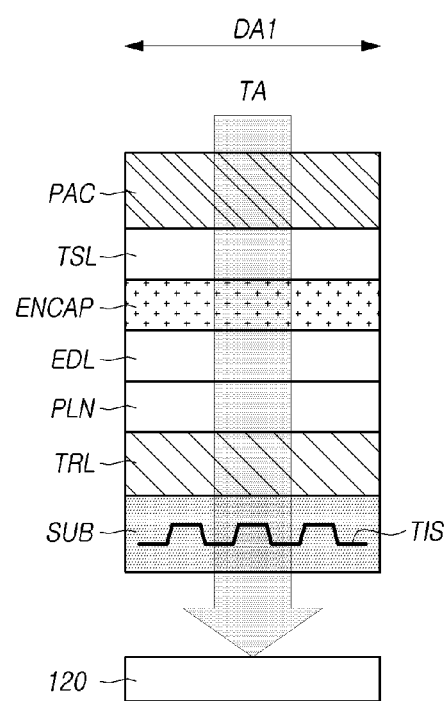
FIGS. 7A, 7B, and 7C illustrate transmittance improving structures and their positions in the display device according to embodiments of the present disclosure.
Figure 7B:
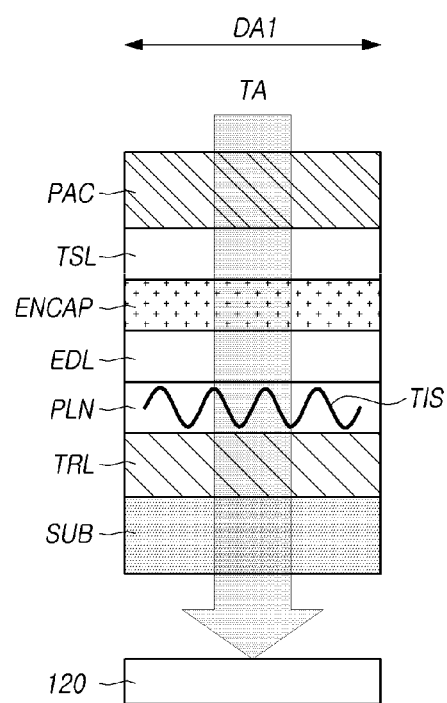
Figure 7C:
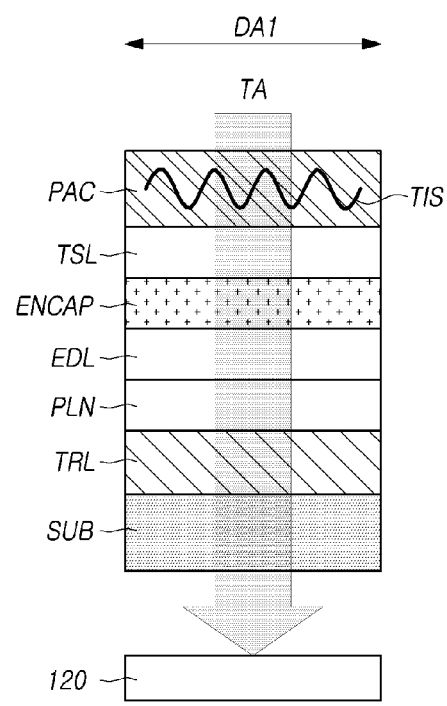

FIGS. 7A, 7B, and 7C illustrate transmittance improving structures TIS and their positions in the display device 100 according to embodiments of the present disclosure.

Referring to FIGS. 7A, 7B and 7C, in the display device 100 according to the embodiments of the present disclosure, the substrate SUB or at least one insulating layer (e.g., PLN, PAC, etc.) among the plurality of insulating layers (MBUF, ABUF1, ABUF2, GI, ILD1, ILD2, PAS0, PLN1, PLN2, BANK, PAS1, PCL, PAS2, PAC) can have a transmittance improving structure TIS in a portion overlapping the transmissive area TA in the first display area DA1.

Here, the transmittance improving structure TIS can include at least one hole or at least one uneven portion (also called stepped portion).

As described above, in the display device 100 according to the embodiments of the present disclosure, the substrate SUB or at least one insulating layer (e.g., PLN, PAC, etc.) among the plurality of insulating layers (MBUF, ABUF1, ABUF2, GI, ILD1, ILD2, PAS0, PLN1, PLN2, BANK, PAS1, PCL, PAS2, PAC) can have a variable thickness in a portion overlapping the transmissive area TA.

Referring to FIG. 7A, the substrate SUB can include at least one hole or at least one uneven portion as a transmittance improving structure TIS in a portion overlapping the transmissive area TA.

When a hole is formed in a portion of the substrate SUB that overlaps the transmissive area TA, the transmittance of the substrate SUB can be significantly improved.

When the uneven portion is formed in a portion of the substrate SUB that overlaps the transmissive area TA, the uneven portion can serve as a condensing lens. Accordingly, light descending from the upper portion of the substrate SUB can be condensed by the uneven portion. Due to this, more light can be transmitted to the light receiving device 120. Accordingly, the transmittance of the substrate SUB can be significantly improved.

Referring to FIG. 7B, among a plurality of insulating layers, the planarization layer PLN can be disposed between the transistor layer TRL and the light emitting device layer EDL. The planarization layer PLN can have at least one uneven portion (also referred to as a step portion) as a transmittance improving structure TIS in a portion overlapping the transmissive area TA.

When an uneven portion is formed in a portion of the planarization layer PLN that overlaps the transmissive area TA, the uneven portion can serve as a condensing lens. Accordingly, light descending from the top of the planarization layer PLN can be condensed by the uneven portion, and thus, more light can be transmitted to the light receiving device 120. Accordingly, the transmittance of the planarization layer PLN can be significantly improved.

Referring to FIG. 7C, a protective layer PAC among a plurality of insulating layers can be disposed on the touch sensor layer TSL. The protective layer PAC can have at least one uneven portion (also referred to as a step portion) as the transmittance improving structure TIS in a portion overlapping the transmissive area TA.

When an uneven portion is formed in a portion of the protective layer PAC that overlaps the transmissive area TA, the uneven portion can serve as a condensing lens. Accordingly, light descending from the upper part of the protective layer PAC can be condensed by the uneven portion, and thus, more light can be transmitted to the light receiving device 120. Accordingly, the transmittance of the protective layer PAC can be significantly improved.

Referring to FIGS. 7B and 7C, at least one insulating layer PLN and PAC as the transmittance improving structure TIS can include an organic insulating material.

Referring to FIGS. 7A, 7B, and 7C, at least one insulating layer PLN and PAC serving as the transmittance improving structure TIS can include a photosensitive material. In contrast, the substrate SUB can include a non-photosensitive material.

Referring to FIGS. 7A, 7B and 7C, the shape or size of the uneven portion of the portion where the substrate SUB overlaps the transmissive area TA and the shape or size of the uneven portion of the portion where the at least one insulating layer PLN and PAC overlap the transmissive area TA can be different from each other. For example, the shape of the uneven portion of the portion where the substrate SUB overlaps the transmissive area TA and the shape of the uneven portion of the portion where the at least one insulating layer PLN and PAC overlap the transmissive area TA can be different from each other. Alternatively, the size (e.g., width, depth, etc.) of the uneven portion in the portion where the substrate SUB overlaps the transmissive area TA and the size (e.g., width, depth (thickness), etc.) of the uneven portion in the portion where the at least one insulating film PLN and PAC overlaps the transmissive area TA can be different from each other.

Figure 8:
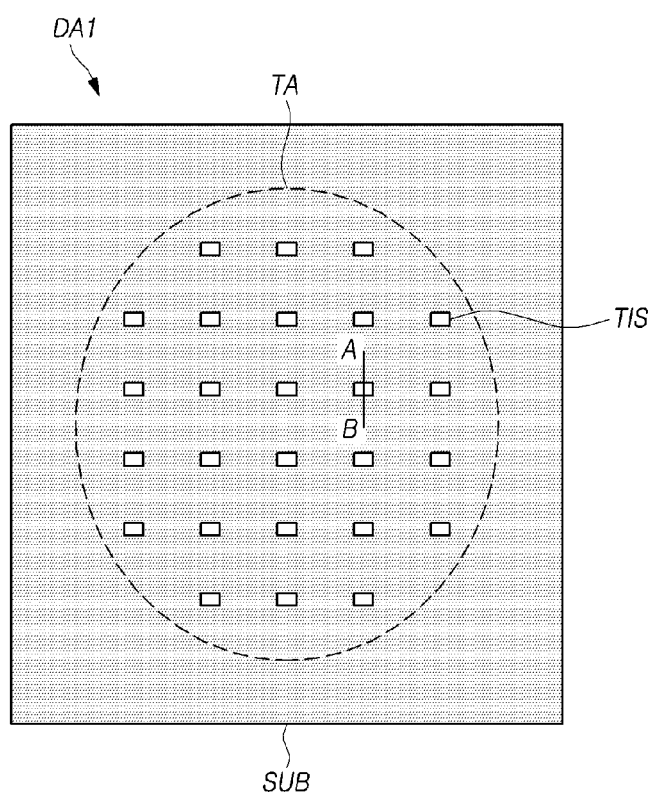
FIG. 8 illustrates a substrate to which a transmittance improving structure is applied in the display device according to embodiments of the present disclosure.

FIG. 8 illustrates the substrate SUB to which a transmittance improving structure TIS is applied in the display device 100 according to embodiments of the present disclosure. FIGS. 9A to 11B are cross-sectional views illustrating the substrate SUB to which various transmittance improving structures TIS are applied in the display device 100 according to embodiments of the present disclosure. FIGS. 9A to 11B are cross-sectional views taken along the line A-B of FIG. 8.

Referring to FIG. 8, the substrate SUB can have a plurality of transmittance improving structures TIS in a portion overlapping the transmissive area TA in the first display area DA1.

Figure 9A:
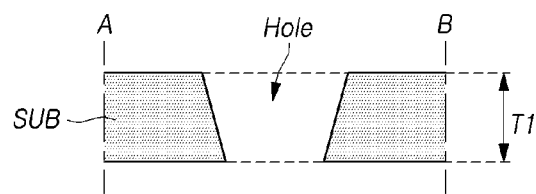
FIGS. 9A-9D, 10A-10D, and 11A-11B are cross-sectional views illustrating the substrate to which various transmittance improving structures are applied in the display device according to embodiments of the present disclosure.

Referring to FIG. 9A, a hole can be formed in a portion of the substrate SUB that overlaps the transmissive area TA. Accordingly, the transmittance of the substrate SUB can be improved. It is assumed that the original thickness of the substrate SUB is T1.

Figure 9B:
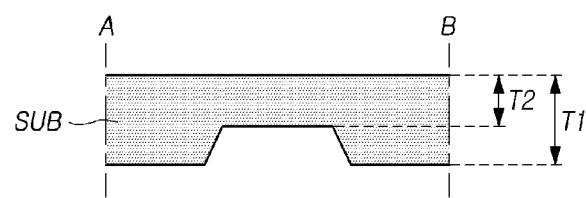

Referring to FIG. 9B, a portion of the substrate SUB that overlaps the transmissive area TA can include at least one raised rear surface, thereby forming at least one uneven portion on the rear surface of the substrate SUB. Accordingly, the substrate thickness T2 of the portion where the rear surface is raised can be thinner than the substrate thickness T1 of the portion where the rear surface is not raised.

Figure 9C:
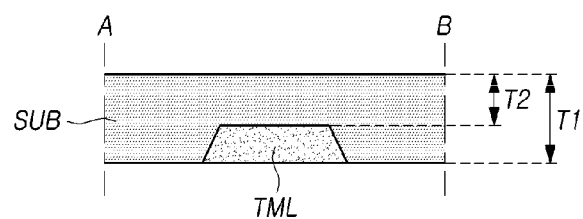

Referring to FIG. 9C, a transparent material layer TML can be disposed under the rear surface raised from the substrate SUB. Here, for example, the transparent material layer TML can include $SiO_2$. The thickness of the transparent material layer TML can correspond to a height at which the rear surface of the substrate SUB is raised.

Figure 9D:
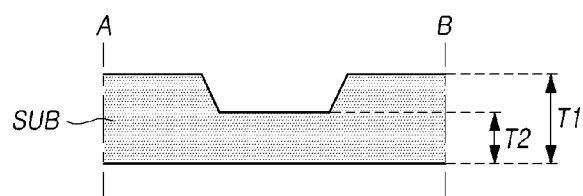

Referring to FIG. 9D, a portion of the substrate SUB that overlaps the transmissive area TA can include at least one recessed upper surface, so that at least one uneven portion can be formed on the upper surface of the substrate SUB. Accordingly, the substrate thickness T2 of the portion in which the upper surface is depressed can be thinner than the substrate thickness T1 of the portion in which the upper surface is not depressed.

Referring to FIGS. 10A-10D and 11A-11B, the substrate SUB can include a first substrate SUB1, an interlayer insulating layer IPD on the first substrate SUB1, and a second substrate SUB2 on the interlayer insulating layer IPD. Since the substrate SUB has a multi-layered structure, penetration of moisture under the substrate SUB can be prevented.

Referring to FIGS. 10A to 10D, a portion of the first substrate SUB1 overlapping the transmissive area TA can include at least one raised rear surface. At least one uneven portion can be formed on the rear surface of the first substrate SUB1. Accordingly, the substrate thickness T2 of the portion where the rear surface is raised can be thinner than the substrate thickness T1 of the portion where the rear surface is not raised.

Referring to FIGS. 10A to 10D, when the display panel 110 is manufactured, the substrate SUB can be formed on the glass.

During the manufacturing process of the display panel 110, the glass can be removed through a laser lift off (LLO) process.

In addition, a sacrificial layer SACL can be formed on the glass, and a substrate SUB can be formed thereon. The sacrificial layer SACL can be removed together with glass during the LLO process. By using the sacrificial layer SACL, it is possible to prevent damage to the interlayer insulating layer IPD during the LLO process.

Figure 10A:
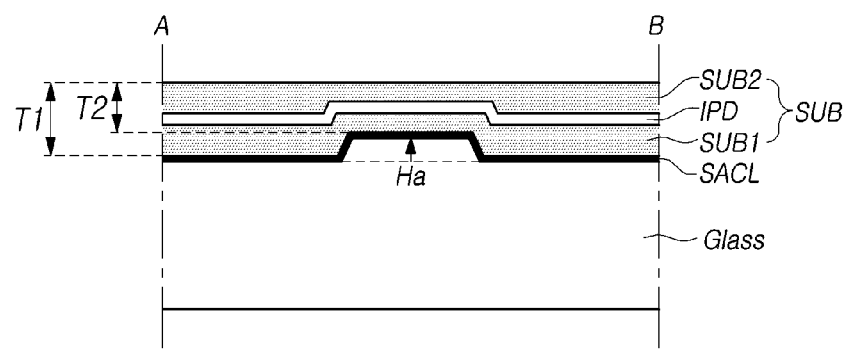
Figure 10B:
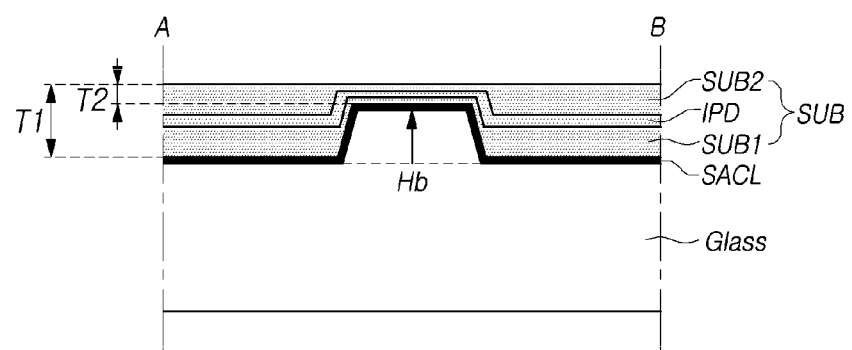

Referring to FIGS. 10A and 10B, the first substrate SUB1 can be formed on glass in which a portion is etched. Accordingly, at least one rear surface can be raised in a portion of the first substrate SUB1 that overlaps the transmissive area TA. The rear surface raised from the first substrate SUB1 can correspond to a portion of the glass that is not etched.

Referring to FIGS. 10A and 10B, the elevation heights Ha and Hb of the rear surface of the first substrate SUB1 can vary according to the degree or the height of etching of the glass.

Figure 10C:
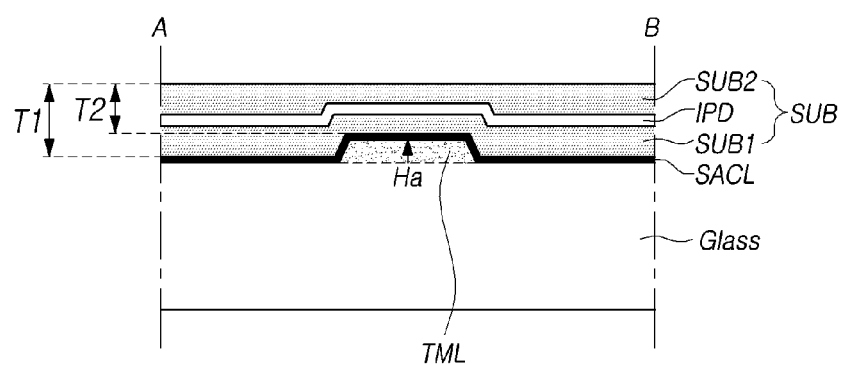
Figure 10D:
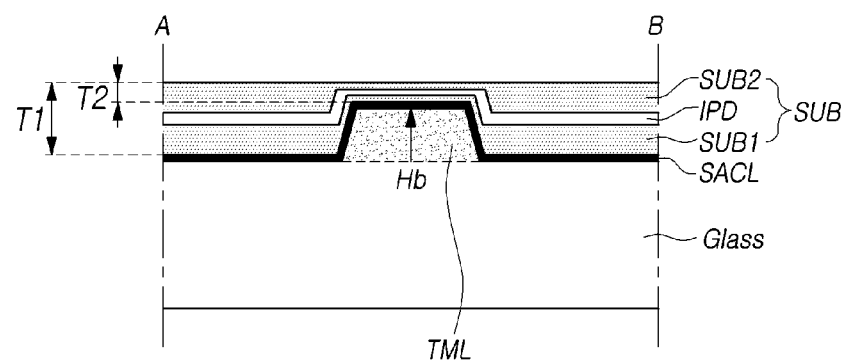

Referring to FIGS. 10C and 10D, a transparent material layer TML can be disposed under the raised rear surface of the first substrate SUB1. Here, for example, the transparent material layer TML can include $SiO_2$. The thicknesses Ha and Hb of the transparent material layer TML can correspond to heights Ha and Hb at which the rear surface of the first substrate SUB1 is raised.

Referring to FIGS. 10C and 10D, in the manufacturing process of the display panel 110, a transparent material layer TML can be formed at a desired height Ha and Hb at specific points on the glass. Thereafter, a substrate SUB can be formed. In this case, the rear surface of the first substrate SUB1 can be raised to a desired height (Ha, Hb).

Figure 11A:
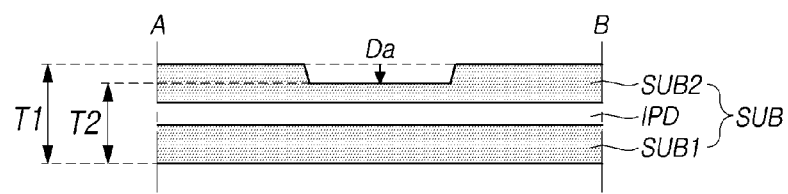
Figure 11B:
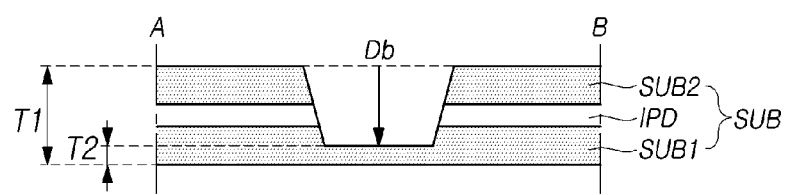

Referring to FIGS. 11A and 11B, after the substrate SUB is formed, the substrate SUB can be etched to form an uneven portion.

Referring to FIG. 11A, when the etching depth Da of the substrate SUB is smaller than the thickness of the second substrate SUB2, a portion of the second substrate SUB2 that overlaps the transmissive area TA can include a recessed upper surface. Accordingly, at least one uneven portion can be formed on the upper surface of the second substrate SUB2. Accordingly, the substrate thickness T2 of the portion in which the upper surface is depressed can be thinner than the substrate thickness T1 of the portion in which the upper surface is not depressed.

Referring to FIG. 11B, when the etching depth Db of the substrate SUB is greater than the thickness of the second substrate SUB2, a portion of the substrate SUB that overlaps the transmissive area TA can include a recessed upper surface. Accordingly, at least one uneven portion can be formed on the upper surface of the substrate SUB. Accordingly, the substrate thickness T2 of the portion in which the upper surface is depressed can be thinner than the substrate thickness T1 of the portion in which the upper surface is not depressed.

Referring to FIG. 11B, when the etching depth Db of the substrate SUB is greater than the thickness of the second substrate SUB2, at least one groove having a predetermined depth Db can be formed in a portion of the substrate SUB that overlaps the transmissive area TA. For example, the at least one groove can include a hole in the second substrate SUB2, a hole in the interlayer insulating layer IPD, and a groove in the first substrate SUB1. For another example, the at least one groove can be formed of a hole of the second substrate SUB2 and a groove of the interlayer insulating layer IPD.

Figure 12:
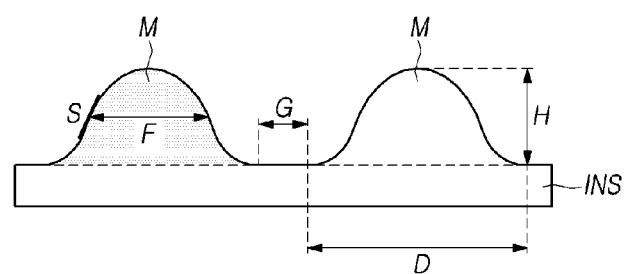
FIG. 12 is a cross-sectional view illustrating an insulating layer to which a transmittance improving structure is applied in the display device according to embodiments of the present disclosure.
Figure 13:
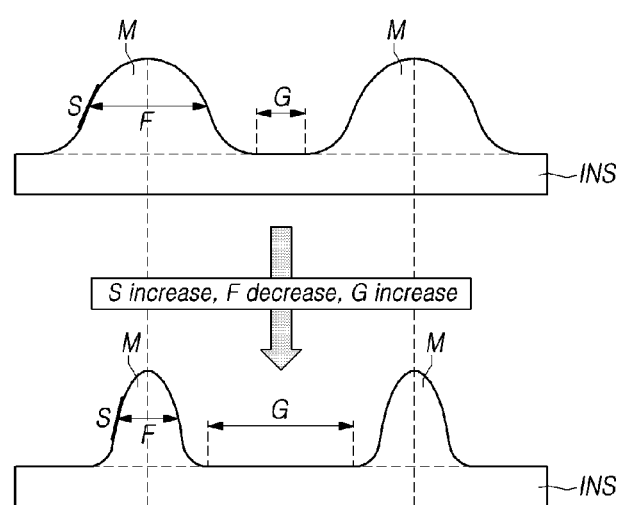
FIG. 13 is a diagram for describing structural characteristics of an insulating layer to which a transmittance improving structure is applied in the display device according to embodiments of the present disclosure.

FIG. 12 is a cross-sectional view illustrating an insulating layer INS to which a transmittance improving structure TIS is applied in the display device 100 according to embodiments of the present disclosure. FIG. 13 is a diagram for describing structural characteristics of an insulating layer INS to which a transmittance improving structure TIS is applied in the display device 100 according to embodiments of the present disclosure.

Referring to FIG. 12, as described above, at least one insulating layer INS of the plurality of insulating layers formed on the display panel 110 can have a transmittance improving structure TIS in a portion overlapping the transmissive area TA in the first display area DA1.

For example, the transmittance improving structure TIS can include at least one uneven portion (also referred to as a step portion).

Referring to FIG. 12, the uneven portion can include a plurality of ridges M.

The ridge M can be defined by a height H, a base length D, a slope S, and the like. The higher the height H, the higher the ridge M can be. And, as the base length D increases, the area of the ridge M can increase. As the slope S increases, the slope of the ridge M becomes steeper and the shape of the ridge M becomes sharper.

Referring to FIG. 12, the shape of the uneven portion of the insulating layer INS can change according to the distance G between two adjacent ridges M. At a certain intermediate height (e.g., ½H) of the ridge M, the middle width F of the ridge M can indicate how sharp the ridge M is.

In order to reduce diffuse reflection of light in the transmissive area TA of the first display area DA1 and reduce light loss when light is transmitted through the transmissive area TA of the first display area DA1, it is necessary to reduce the middle width F of the ridge M.

After going through a general photolithography process, the ridge M can be formed in a state where the middle width F of the ridge M is large. For example, after a general photolithography process, the ridge M with a small valley can be formed, and the ridge M having a large middle width F and a small slope S can be formed. The ridge M in this state has more diffuse reflection components and can decrease light efficiency.

Accordingly, after the photolithography process, by adding a front exposure process to further crosslink the slope of the ridge M, the valley of the ridge M can be deepened. For example, due to the addition of the front exposure process, the ridge M having a small middle width F and a large slope S can be formed. Accordingly, the distance G between the ridges M can also increase. Accordingly, diffuse reflection of the insulating layer INS can be reduced, and light transmission capability of the insulating layer INS can be improved.

The insulating layer INS having the transmittance improving structure TIS as illustrated in FIGS. 12 and 13 can be one or more of a plurality of insulating layers (MBUF, ABUF1, ABUF2, GI, ILD1, ILD2, PAS0, PLN1, PLN2, BANK, PAS1, PCL, PAS2, PAC) formed on the display panel 110.

For example, the insulating layer INS having the transmittance enhancing structure TIS as illustrated in FIGS. 12 and 13 can include at least one of a planarization layer PLN and a protective layer PAC. The planarization layer PLN can be disposed between the transistor layer TRL and the light emitting device layer EDL, and the protective layer PAC can be disposed on or over the touch sensor layer TSL.

Figure 14:
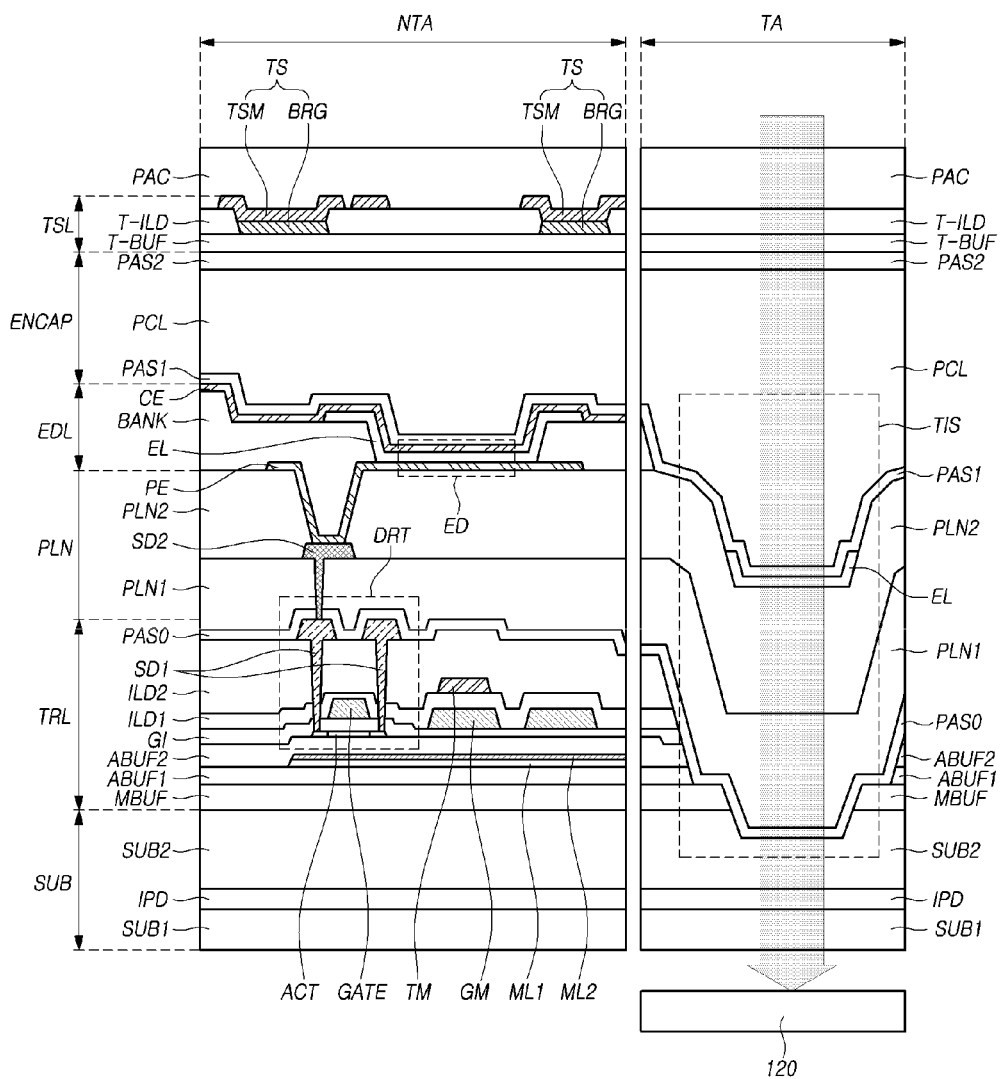
FIGS. 14 and 15 are cross-sectional views illustrating a case in which a transmittance improving structure is applied in the transmissive area in the display device according to embodiments of the present disclosure.
Figure 15:
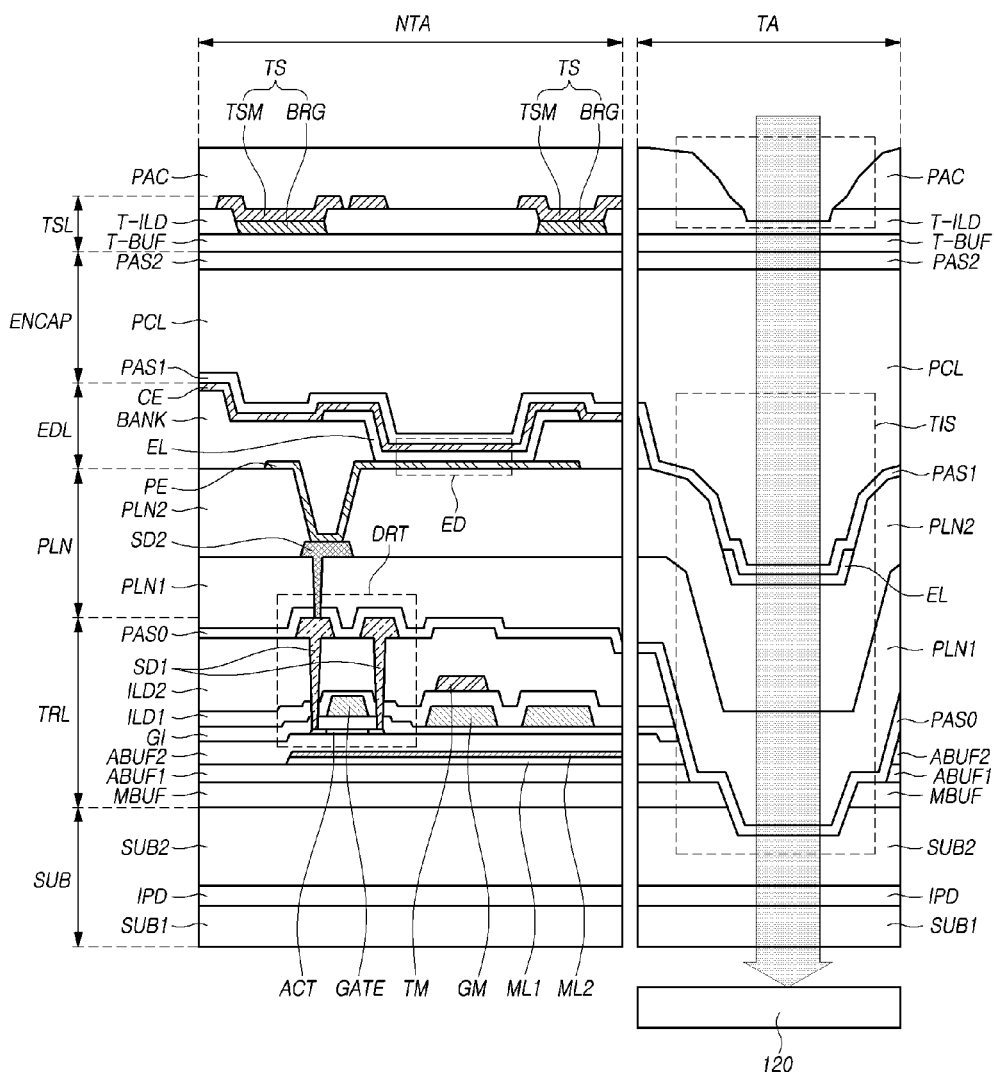

FIGS. 14 and 15 are cross-sectional views of the display device 100 according to embodiments of the present disclosure, and are cross-sectional views when the transmittance improving structure TIS is applied in the transmissive area TA.

The stacked structure of FIGS. 14 and 15 is basically the same as the stacked structure of FIG. 6. However, the stacked structures of FIGS. 14 and 15 further include a transmittance improving structure TIS in the transmissive area TA.

Referring to FIG. 14, a plurality of insulating layers included in the display panel 110 can include the buffer layers (MBUF, ABUF1, ABUF2) between the substrate SUB and the transistors (DRT, SCT), the planarization layer PLN) between the transistors (DRT, SCT) and the light emitting device ED), and the encapsulation layer ENCAP on the light emitting device ED, etc.

As shown in FIG. 14, among the plurality of insulating layers, the planarization layer PLN can include at least one uneven portion as a transmittance improving structure TIS in a portion overlapping the transmissive area TA in the first display area DA1. Here, the planarization layer PLN can be an organic insulating layer.

Referring to FIG. 14, the concave portion constituting at least one uneven portion of the planarization layer PLN can pass through the insulating layers ILD2, IDL1 and GI included in the transistor layer TRL and the buffer layer ABUF1, ABUF2 and MBUF positioned under the insulating layers ILD2, IDL1 and GI, and can descend to the top of the substrate SUB. Accordingly, the upper surface of the substrate SUB is depressed, so that at least one uneven portion can be formed in the substrate SUB as the transmittance improving structure TIS.

Referring to FIGS. 14 and 15, the first encapsulation layer PAS1 and the second encapsulation layer PCL included in the encapsulation layer ENCAP can also have a transmittance improving structure TIS in a recessed form. Here, the first encapsulation layer PAS1 can be an inorganic insulating layer, and the second encapsulation layer PCL can be an organic insulating layer.

Referring to FIGS. 14 and 15, the protective layer PAC can be disposed to cover the touch sensor TS on the encapsulation layer ENCAP, so as to protect the touch sensor TS.

As illustrated in FIG. 15, the protective layer PAC can have at least one uneven portion as a transmittance improving structure TIS in a portion overlapping the transmissive area TA. Here, the protective layer PAC can be an organic insulating layer.

Referring to FIGS. 14 and 15, each of the plurality of touch sensors TS can be formed of a mesh-type touch sensor metal TSM. When the touch sensor metal TSM is formed in a mesh type, a plurality of open areas can exist in the touch sensor metal TSM of one touch sensor TS. The position of each of the plurality of open areas can correspond to the position of the emission area of the subpixel SP.

The area of the touch sensor metals TSM per unit area in the first display area DA1 can be smaller than the area of the touch sensor metal TSM per unit area in the second display area DA2 so that the transmittance of the first display area DA1 is higher than the transmittance of the second display area DA2.

To this end, as shown in FIGS. 14 and 15, among at least one non-transmissive area NTA and at least one transmissive area TA in the first display area DA1, the plurality of touch sensors TS can be disposed in at least one non-transmissive area NTA, and the plurality of touch sensors TS may not be disposed in the at least one transmissive area TA.

Figure 16:
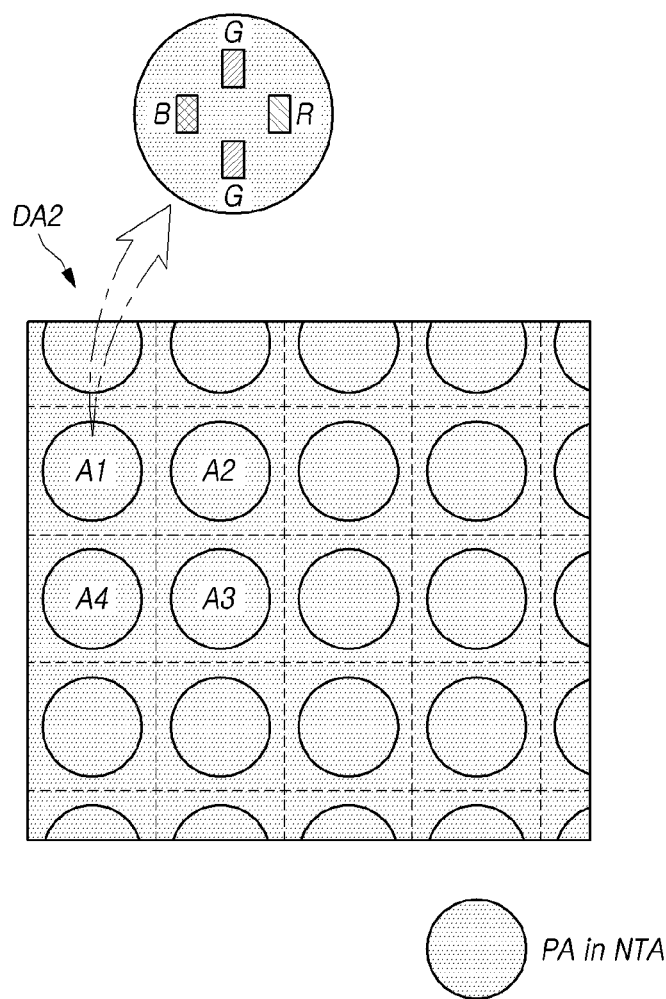
FIG. 16 illustrates an arrangement of subpixels in the second display area of the display device according to embodiments of the present disclosure.
Figure 17A:
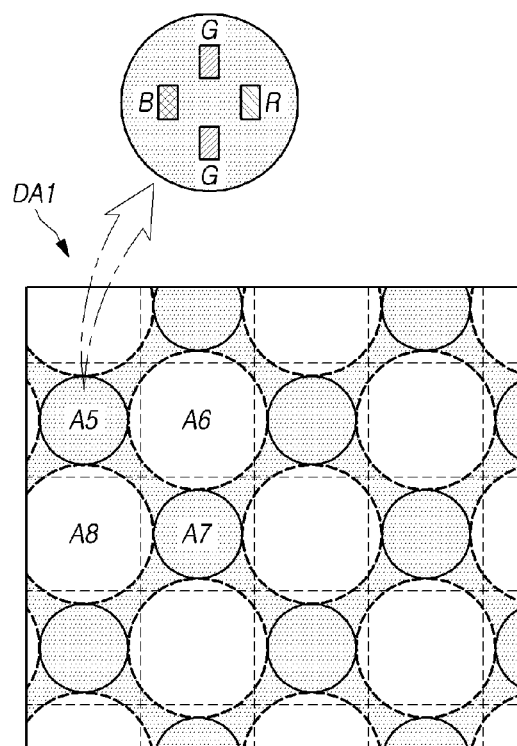
FIGS. 17A and 17B illustrate an arrangement of subpixels in the first display area of the display device according to embodiments of the present disclosure.
Figure 17A:
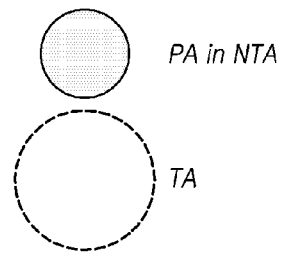
Figure 17B:
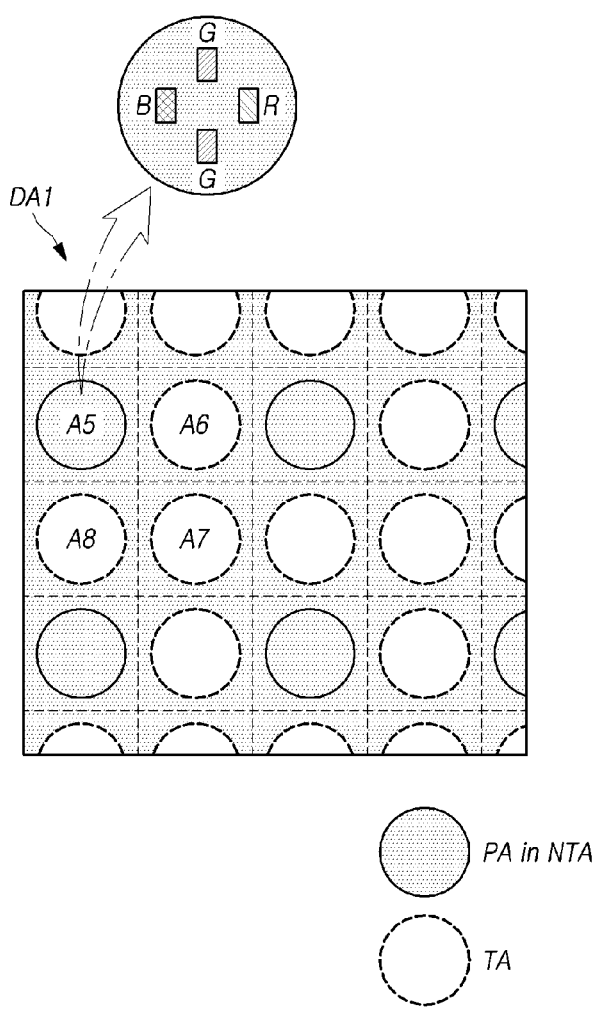

FIG. 16 illustrates an arrangement of subpixels SP in the second display area DA2 of the display device 100 according to embodiments of the present disclosure. FIGS. 17A and 17B illustrate an arrangement of subpixels SP in the first display area DA1 of the display device 100 according to embodiments of the present disclosure.

Referring to FIG. 16, the second display area DA2 can include a first area A1, a second area A2, a third area A3, and a fourth area A4. Each of the first area A1, the second area A2, the third area A3, and the fourth area A4 can be a pixel area PA in the non-transmissive area NTA in which four subpixels SP (R, G, B, G) are disposed.

Referring to FIGS. 17A and 17B, the first display area DA1 can include a fifth area A5, a sixth area A6, a seventh area A7, and an eighth area A8. Among the fifth area A5, sixth area A6, seventh area A7, and eighth area A8, some areas (e.g., A5, A7) can be the non-transmissive areas NTA in which four subpixels SP (R, G, B, G) are disposed, and other areas (e.g., A6, A8) can be a transmissive area TA in which the subpixel SP is not disposed.

Accordingly, the number of subpixels per unit area in the first display area DA1 can be smaller than the number of subpixels per unit area in the second display area DA2. For example, the number of subpixels per unit area in the first display area DA1 can be ½ or ¼ of the number of subpixels per unit area in the second display area DA2. Accordingly, the transmittance of the first display area DA1 can be higher than transmittance of the second display area DA2. For example, the transmittance of the first display area DA1 can be twice or four times the transmittance of the second display area DA2.

Referring to FIG. 17A, among the fifth area A5, the sixth area A6, the seventh area A7, and the eighth area A8, two areas A5 and A7 can be the non-transmissive areas NTA and can be a pixel area PA in which four subpixels SP (R, G, B, G) are disposed, and the other two areas A6 and A8 can be a transmissive area TA in which no subpixels SP are disposed. The area of each of the fifth area A5 and the seventh area A7, which is the non-transmissive area NTA, can be smaller than the area of each of the sixth area A6 and the eighth area A8, which is the transmissive area TA. The area of each of the fifth area A5 and the seventh area A7, which is the non-transmissive area NTA in the first display area DA1, can be smaller than the area of each of the first to fourth areas A1 to A4, which is the non-transmissive area NTA in the second display area DA2.

In this case, the number of subpixels per unit area in the first display area DA1 can be ½ of the number of subpixels per unit area in the second display area DA2. The transmittance of the first display area DA1 can be twice or more times the transmittance of the second display area DA2.

Referring to FIG. 17B, among the fifth area A5, the sixth area A6, the seventh area A7, and the eighth area A8, one areas A5 can be the non-transmissive areas NTA and can be a pixel area PA in which four subpixels SP (R, G, B, G) are disposed, and the other three areas A6, A7 and A8 can be a transmissive area TA in which no subpixels SP are disposed. The area of the fifth area A5, which is the non-transmissive area NTA, can be the same as the area of each of the sixth area A6, the seventh area A7, and the eighth area A8, which are the transmissive areas TA.

In this case, the number of subpixels per unit area in the first display area DA1 can be ¼ of the number of subpixels per unit area in the second display area DA2. The transmittance of the first display area DA1 can be four times of the transmittance of the second display area DA2.

According to embodiments of the present disclosure, the display device 100 in which a light receiving device 120 (e.g., camera, proximity sensor, etc.) is positioned behind the display panel 110 can be provided so that the light receiving device 120 that should receive light from the front is not exposed to the front.

According to embodiments of the present disclosure, even if the light receiving device 120 is positioned behind the display panel 120, it is possible to provide the display device 100 in which light from the front surface of the display panel 110 can be well transmitted to the light receiving device 120 through the display panel 110.

According to embodiments of the present disclosure, it is possible to provide the display device 100 having a higher transmittance in the display panel 110 in a region overlapping with the light receiving device 120 compared to other regions.

According to embodiments of the present disclosure, the display device 100 in which a transmittance improving structure is formed in a region overlapping with the light receiving device 120 in the display panel 100 can be provided.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present disclosure. The above description and the accompanying drawings provide an example of the technical idea of the present disclosure for illustrative purposes only. For example, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device comprising:
   a display panel including a substrate and a plurality of insulating layers, a transistor layer, and a light emitting device layer on the substrate, the display panel including a display area in which an image is displayed, the display area including a first display area and a second display area; and
   a light receiving device positioned behind the display panel and overlapping with the first display area,
   wherein at least a portion of the first display area overlapping the light receiving device includes a number of subpixels per unit area smaller than a number of subpixels per unit area in the second display area, the number of subpixels per unit area in at least the portion of the first display area overlapping the light receiving device being a positive integer greater than or equal to 1,
   wherein the first display area includes at least one non-transmissive area in which transistors of the transistor layer and light emitting devices of the light emitting device layer are located, and at least one transmissive area through which external light is transmitted to the light receiving device, and
   wherein the substrate or at least one insulating layer among the plurality of insulating layers includes at least one hole or at least one uneven portion in a portion overlapping the at least one transmissive area.

2. The display device according to claim 1, wherein the at least one uneven portion is formed on a rear surface of the substrate, and a portion of the substrate that overlaps the at least one transmissive area includes at least one raised rear surface.

3. The display device according to claim 2, further comprising a transparent material layer disposed under the at least one raised rear surface of the substrate.

4. The display device according to claim 1, wherein the at least one uneven portion is formed on an upper surface of the substrate, and a portion of the substrate that overlaps the at least one transmissive area includes at least one recessed upper surface.

5. The display device according to claim 1, wherein the substrate includes a first substrate, an interlayer insulating layer on the first substrate, and a second substrate on the interlayer insulating layer, and
   wherein the at least one uneven portion is formed on a rear surface of the first substrate, and a portion of the first substrate that overlaps the at least one transmissive area includes at least one raised rear surface.

6. The display device according to claim 5, further comprising a transparent material layer disposed under the at least one raised rear surface of the first substrate.

7. The display device according to claim 1, wherein the substrate includes a first substrate, an interlayer insulating layer on the first substrate, and a second substrate on the interlayer insulating layer, and
   wherein the at least one uneven portion is formed on an upper surface of the second substrate, and a portion of the second substrate that overlaps the at least one transmissive area includes at least one recessed upper surface or the at least one hole.

8. The display device according to claim 1, wherein the plurality of insulating layers comprise:
   a buffer layer between the substrate and the transistor layer;
   a planarization layer between the transistor layer and the light emitting device layer; and
   an encapsulation layer on the light emitting device layer, and
   wherein the planarization layer includes the at least one uneven portion at a portion overlapping the at least one transmissive area in the first display area.

9. The display device according to claim 8, wherein a concave portion constituting the at least one uneven portion of the planarization layer passes through the insulating layers included in the transistor layer and the buffer layer positioned under the insulating layers and descends to the upper portion of the substrate.

10. The display device according to claim 8, wherein the display panel further includes a plurality of touch sensors disposed on the encapsulation layer, and a protective layer on the plurality of touch sensors, and
    wherein the protective layer includes at least one uneven portion at a portion overlapping the at least one transmissive area.

11. The display device according to claim 10, wherein the plurality of touch sensors include mesh-type touch sensor metals, and an area of the touch sensor metals per unit area in the first display area is smaller than an area of the touch sensor metals per unit area in the second display area.

12. The display device according to claim 10, wherein among the at least one non-transmissive area and the at least one transmissive area in the first display area, the plurality of touch sensors are disposed in the at least one non-transmissive area and the plurality of touch sensors are not disposed in the at least one transmissive area.

13. The display device according to claim 1, wherein the at least one insulating layer includes an organic insulating material.

14. The display device according to claim 1, wherein the at least one insulating layer includes a photosensitive material.

15. The display device according to claim 1, wherein the substrate includes a non-photosensitive material.

16. The display device according to claim 1, wherein a shape or size of a concave-convex portion in a portion where the substrate overlaps the at least one transmissive area, and a shape or size of a concave-convex portion in a portion where the at least one insulating layer overlaps the at least one transmissive area are different from each other.

17. The display device according to claim 1, wherein the second display area includes a first area, a second area, a third area, and a fourth area,
    wherein each of the first area, the second area, the third area, and the fourth area is the at least one non-transmissive area in which four subpixels are disposed,
    wherein the first display area includes a fifth area, a sixth area, a seventh area, and an eighth area,
    wherein areas of the fifth area, the sixth area, the seventh area, and the eighth area correspond to areas of the first area, the second area, the third area, and the fourth area, and
    wherein among the fifth area, the sixth area, the seventh area, and the eighth area, some areas are the at least one non-transmissive area in which four subpixels are disposed, and another partial area is the at least one transmissive area in which no subpixels are disposed.

18. The display device according to claim 1, wherein the number of subpixels per unit area in the first display area is about ½ or ¼ of the number of subpixels per unit area in the second display area.

19. The display device according to claim 1, wherein the light receiving device includes at least one of a camera and a proximity sensor, and the light receiving device is not exposed on a front surface of the display device.

20. A display device comprising:
    a display panel including a substrate and a plurality of insulating layers, a transistor layer, and a light emitting device layer on the substrate, the display panel including a display area in which an image is displayed, the display area including a first display area and a second display area; and
    a light receiving device positioned behind the display panel and overlapping with the first display area,
    wherein at least a portion of the first display area overlapping the light receiving device includes a number of subpixels per unit area smaller than a number of subpixels per unit area in the second display area, the number of subpixels per unit area in at least the portion of the first display area overlapping the light receiving device being a positive integer greater than or equal to 1,
    wherein the first display area includes at least one non-transmissive area in which transistors of the transistor layer and light emitting devices of the light emitting device layer are located, and at least one transmissive area through which external light is transmitted to the light receiving device, and
    wherein the substrate or at least one of the plurality of insulating layers has a variable thickness in a portion overlapping the at least one transmissive area.

* * * * *